United States Patent
Sivadas et al.

(10) Patent No.: US 10,784,215 B2
(45) Date of Patent: Sep. 22, 2020

(54) MILLIMETER WAVE INTEGRATED CIRCUIT AND SYSTEM WITH A LOW LOSS PACKAGE TRANSITION

(71) Applicant: Steradian Semiconductors Private Limited, Bangalore (IN)

(72) Inventors: Apu Sivadas, Bangalore (IN); Alok Prakash Joshi, Bangalore (IN); Gireesh Rajendran, Bangalore (IN)

( * ) Notice: Subject to any disclaimer, the term of this patent is extended or adjusted under 35 U.S.C. 154(b) by 0 days.

(21) Appl. No.: 16/266,122

(22) Filed: Feb. 4, 2019

(65) Prior Publication Data

US 2020/0161257 A1    May 21, 2020

(30) Foreign Application Priority Data

Nov. 15, 2018   (IN) .............................. 201841042914

(51) Int. Cl.
| | |
|---|---|
| H01L 23/66 | (2006.01) |
| H01L 23/00 | (2006.01) |
| H01Q 1/22 | (2006.01) |
| H01P 3/08 | (2006.01) |

(52) U.S. Cl.
CPC .............. *H01L 23/66* (2013.01); *H01L 24/02* (2013.01); *H01L 24/14* (2013.01); *H01L 24/16* (2013.01); *H01P 3/081* (2013.01); *H01Q 1/2283* (2013.01); *H01L 2223/6638* (2013.01); *H01L 2224/02373* (2013.01); *H01L 2224/1412* (2013.01); *H01L 2224/16225* (2013.01)

(58) Field of Classification Search
None
See application file for complete search history.

(56) References Cited

U.S. PATENT DOCUMENTS

| | | | | |
|---|---|---|---|---|
| 6,469,383 | B1* | 10/2002 | Welstand | H01L 23/66 |
| | | | | 257/737 |
| 6,639,322 | B1* | 10/2003 | Welstand | H01L 21/563 |
| | | | | 257/728 |
| 7,212,088 | B1* | 5/2007 | Norregaard | H01L 23/64 |
| | | | | 333/238 |
| 7,439,822 | B2* | 10/2008 | Shimura | H01P 5/08 |
| | | | | 333/26 |
| 8,564,383 | B2* | 10/2013 | Shimura | H01P 3/121 |
| | | | | 333/247 |
| 8,680,689 | B1* | 3/2014 | Daubenspeck | H01L 25/0657 |
| | | | | 257/778 |
| 9,219,041 | B2* | 12/2015 | Elad | H01L 23/66 |
| 9,257,751 | B2* | 2/2016 | Felic | H01Q 9/045 |

(Continued)

*Primary Examiner* — Telly D Green

(57) ABSTRACT

According to an aspect of the present invention, an electronic system (499) operative on a millimeter signal comprises an integrated circuit (401) comprising a first solder ball (420A) and a second solder ball (420B) respectively coupled to a positive and a negative signal interface points (412 and 413) of a differential millimeter signal on a die (410) housed in the integrated circuit (401), wherein the first and the second solder balls (420A and 420B) are positioned one behind other from an edge of the integrated circuit (401) and a three-path coplanar waveguide (CPW) comprising a center path (495B) and a two adjacent paths (495A and 495C) formed on a printed circuit board (PCB) (490) such that the center path (495B) is coupled to the first solder ball that is in front and the two adjacent paths coupled to the second solder ball that is behind the first solder ball.

6 Claims, 13 Drawing Sheets

(56) References Cited

U.S. PATENT DOCUMENTS

| | | | | |
|---|---|---|---|---|
| 9,502,382 | B2* | 11/2016 | Cho | H01P 1/047 |
| 2005/0040915 | A1* | 2/2005 | Ryu | H01P 1/181 |
| | | | | 333/161 |
| 2006/0274992 | A1* | 12/2006 | Shimura | H01P 5/08 |
| | | | | 385/14 |
| 2011/0057741 | A1* | 3/2011 | Dayan | H01P 5/107 |
| | | | | 333/26 |
| 2011/0260943 | A1* | 10/2011 | Felic | H01Q 9/045 |
| | | | | 343/860 |
| 2013/0075904 | A1* | 3/2013 | Cho | H01P 1/047 |
| | | | | 257/738 |
| 2013/0099389 | A1* | 4/2013 | Hong | H01Q 21/0025 |
| | | | | 257/774 |
| 2013/0256850 | A1* | 10/2013 | Danny | H01L 23/66 |
| | | | | 257/664 |
| 2019/0157738 | A1* | 5/2019 | Shook | H03H 7/38 |

* cited by examiner

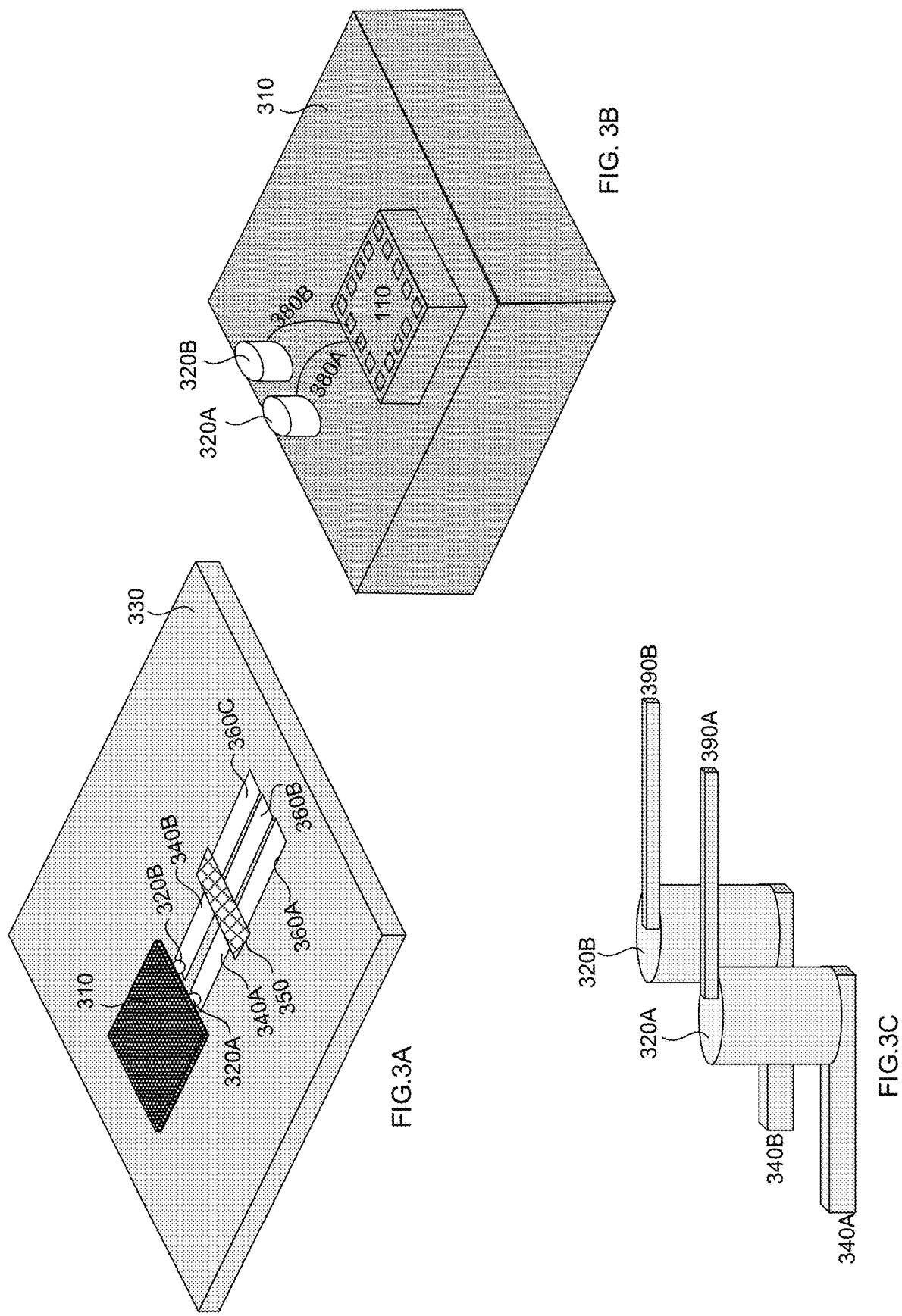

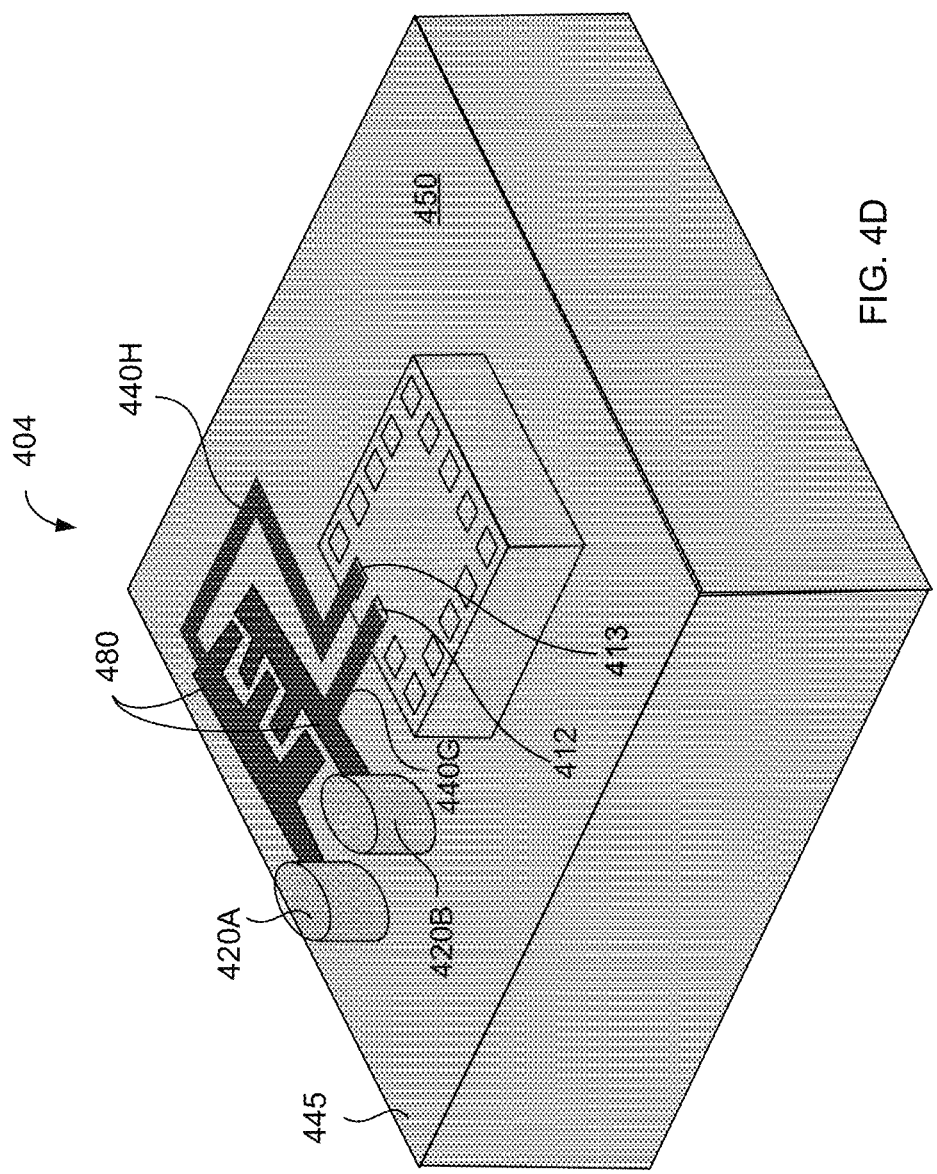

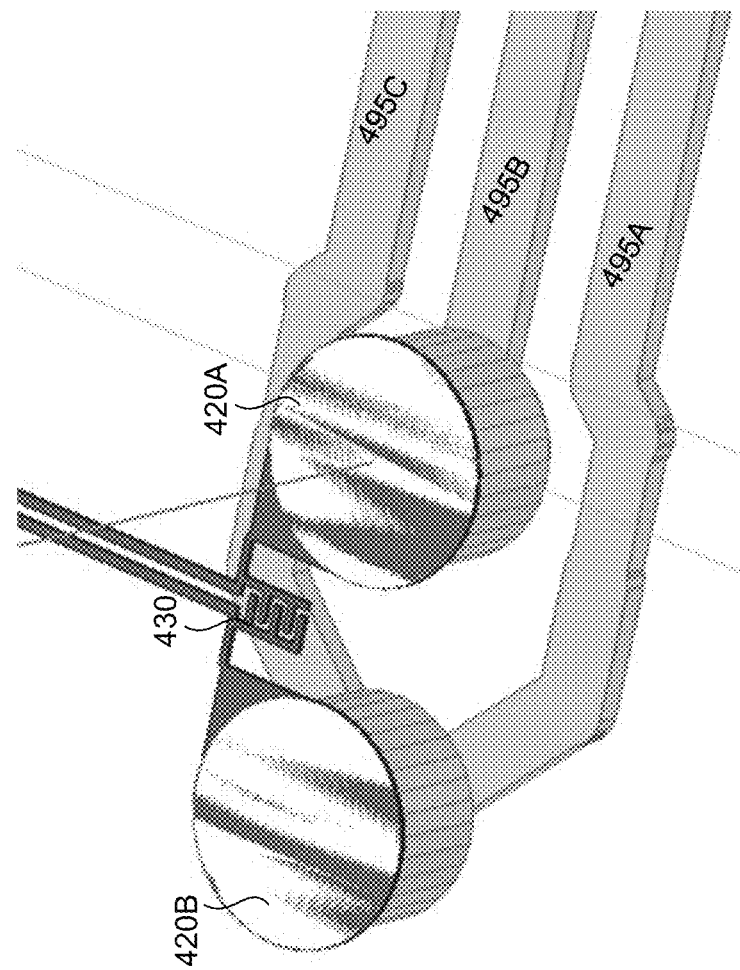

MILLIMETER WAVE INTEGRATED CIRCUIT AND SYSTEM WITH A LOW LOSS PACKAGE TRANSITION

CROSS REFERENCES TO RELATED APPLICATIONS

This application claims priority from Indian patent application No. 201841042914 filed on Nov. 15, 2018 which is incorporated herein in its entirety by reference.

FIELD OF INVENTION

Embodiments of the present disclosure relate to millimeter wave electronic system and in particular relate to a millimeter wave integrated circuit and system with a low loss package transition.

RELATED ART

Often electronic systems are built by mounting several integrated circuits on one or more printed circuit boards (PCB). As is well known in the art, the PCB establishes conductive signal paths between the terminals (pins) of the integrated circuits mounted on the PCBs. The layout, routing, thickness, width of the conductive paths, other supporting paths, placement of the integrated circuits and other electronic/electrical circuit elements are first designed then fabricated (etching process) to form the PCB.

The Integrated circuit generally comprises a die and a package. FIG. 1A illustrates an example die 110 with interface point's 120A-120N. FIG. 1B illustrates an example integrated circuit comprising package 160 and the die 110. The pins 170A-170N such as ball grid array (generally referred to as solder balls, solder bumps, metal ball) are formed on the package 160 such that it exposes outside of the package to provide connectivity to the conducting path on the PCB. On the inside, the solder balls 170A-170N are connected to different interface points 120A-120N on the die using package interconnect technologies such as wire bond (180A-180N), flip chip, bond pads, for example. In case of integrated circuit developed for handling millimeter wave signals, an extended wafer level ball out package (eWLB) is employed. FIG. 1C illustrates an example eWLB package. In that, the planar conducting strips 190A-190N are formed on the inner surface of the plane 195. The plane 195 is mounted on the die (wafer) such that the conducting strips conductively overlaps on the interface point's 120A-120N. The solder ball 170A-170N are formed across the plane 195 such that the solder ball makes electrical contact with the strip on one side of the plane 195 and extend on other side of the plane for external interface. FIG. 1D illustrates the manner in which the interface point 120K, conductive strip 190K and solder ball 170K are formed across plane 195 in an eWLB package. The state of art in the package interconnect is further described in a paper titled "mmWave Semiconductor Industry Technologies: Status and Evolution" by author "Uwe Rüddenklau" published by ETSI (European Telecommunications Standards Institute) White Paper No. 15, which is incorporated herein in its entirety by reference.

In case of integrated circuits operative at millimeter wavelength (sending and receiving millimeter wave signals on the solder balls), the interface to the solder balls are specifically designed to handle the millimeter wave signal on the PCB with low attenuation. The millimeter wave signal experiences attenuation when the length of the signal path is larger. Each millimeter eave signal interface on the integrated circuit is often referred to as Radio Frequency Frontend (RFFE).

FIGS. 2A, 2B and 2C illustrates conventional electronic system, integrated circuit and interface details respectively. As shown there, the conventional electronic system 201 comprises: integrated circuit 210 with 3 ball (211A-211C) counts per RFFE mounted on the PCB 230. A coplanar wave guide (CPW) comprising a signal path 250 and two ground paths (260A and 260B) flagged on either side of the signal path 250 employed on the PCB 230. The coplanar wave guide (CPW) structure/scheme reduces the attenuation or power loss on the PCB and hence is largely employed to carry millimeter wave signal on the PCB as is well known in the art. Accordingly, as shown in the FIGS. 2B and 2C, the millimeter wave signal interface from the die is provided on the 3 interface points (three of 120A-120N). The signal from the interface points is further connected to the 3 solder balls (211A-211C) through wire bonds 270A-C and in case of millimeter integrated circuits through conductive strips 290A-290C. The three-solder ball (211A-211C) structures on the integrated circuit enable convenient formation of CPW paths 250, 260A and 260B (one to one per ball count) on the PCB 230. Such conventional interconnect requires large number of solder balls (or higher ball count per RFFE) to interface millimeter signal there by increasing the overall ball count and area of the integrated circuit.

FIGS. 3A, 3B and 3C illustrates another conventional electronic system, another conventional integrated circuit and interface details respectively. As shown there another conventional electronic system comprises integrated circuit 310 with 2 ball count 320A and 320B per RFFE mounted on the PCB 330. In this conventional scheme, a differential millimeter wave signal paths 340A and 340B are employed on the PCB 330 and subsequently converted to CPW paths 360A, 360B and 360C using Balun 350. The millimeter wave signal interface from the die is provided on the interface point's 370A-B as differential signal. The signal from the interface points is further connected to the 2 solder balls (320A-320B) interface through wire bonds 380A-B and in case of millimeter wave integrated circuit through conductive strips 390A and 390B. The two solder balls (320A & 320B) structures on the integrated circuit reduces the number of solder ball count per RFFE, however increases the additional circuitry like Balun 350 on the PCB 330.

SUMMARY

According to an aspect of the present invention, an electronic system operative on a millimetre signal comprises an integrated circuit comprising a first solder ball and a second solder ball respectively coupled to a positive and a negative signal interface points of a differential millimetre signal on a die housed in the integrated circuit, wherein the first and the second solder balls are positioned one behind other from an edge of the integrated circuit and a three-path coplanar waveguide (CPW) comprising a center path and a two adjacent paths formed on a printed circuit board (PCB) such that the center path is coupled to the first solder ball that is in front and the two adjacent paths coupled to the second solder ball that is behind the first solder ball.

According to another aspect, the electronic system further comprising plurality of strip pads formed on an inner surface of a plane in the package such that, the plurality of strips make electrical connectivity with the first and the second solder balls and the positive and the negative interface points on the die when the package is an extended wafer level ball package (eWLB). The system further comprising a compensation network electrically interposed between the first and second solder balls and the positive and the negative interface points on the die, in that the compensation network is formed on the eWLB package of the integrated circuit.

According to another aspect of the present invention the electronic system further comprising a transition structure on the PCB to provide transition from the CPW to a micro strip line, in that, the transition structure provides flaring of the two adjacent paths at first angle away from the centre path, where the centre path transition to micro strip line. In that, the transition structure from a wing on each of the two adjacent paths with an arc angle, a first length along the centre path and second length on the other side of the wing.

BRIEF DESCRIPTION OF DRAWINGS

FIGS. 3A, 3B and 3C illustrates another conventional electronic system, another conventional integrated circuit and interface details respectively.

FIG. 4D depicts coupling of terminals of the comb capacitor to the strip pads for propagating millimetre wave signals.

FIG. 4F depicts the details of the OPCN 430 on the package.

DETAILED DESCRIPTION OF THE PREFERRED EXAMPLES

Figure 1A:
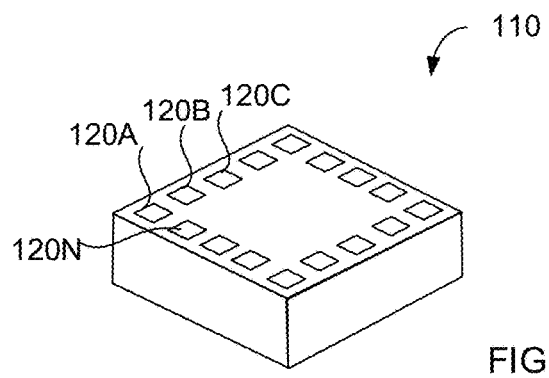
FIG. 1A illustrates an example die with interface points.
Figure 1B:
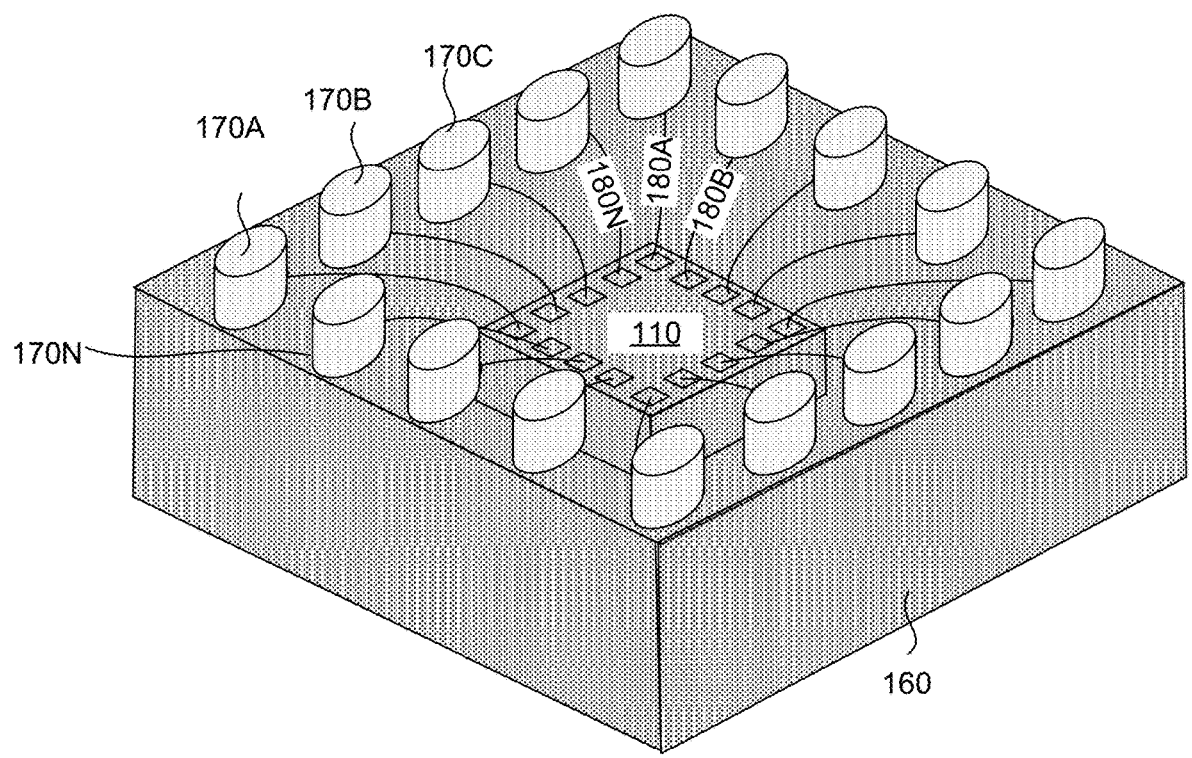
FIG. 1B illustrates an example integrated circuit comprising package and the die.
Figure 1C:
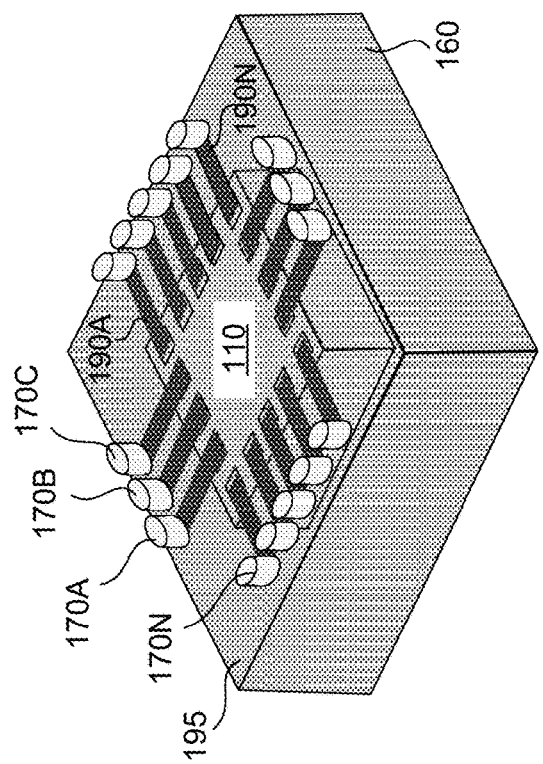
FIG. 1C illustrates an example eWLB package.
Figure 1D:
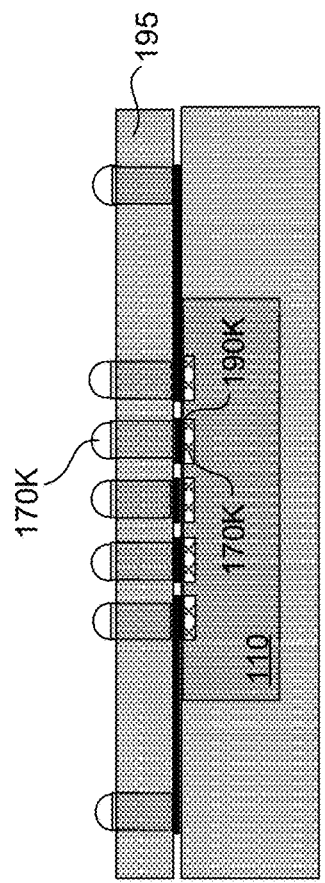
FIG. 1D illustrates the manner in which the interface point, conductive strip and solder ball are formed across a plane in an eWLB package.
Figure 2A:
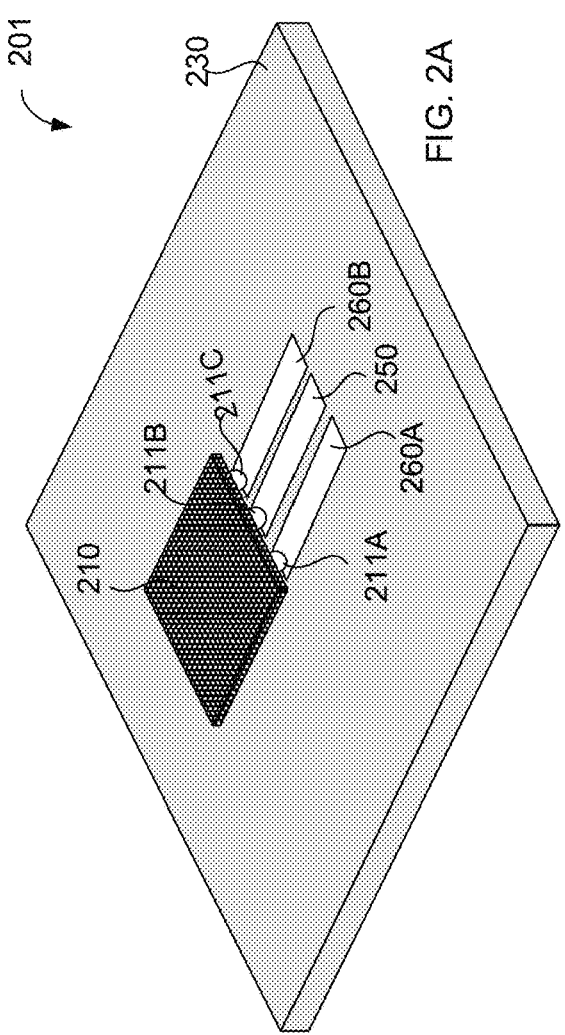
FIGS. 2A, 2B and 2C illustrates conventional electronic system, integrated circuit and interface details respectively.
Figure 2B:
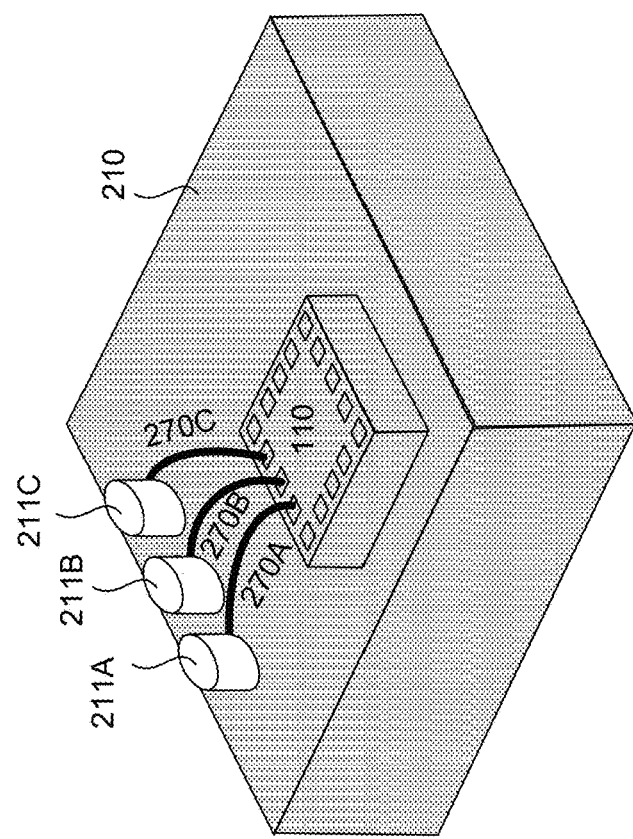
Figure 2C:
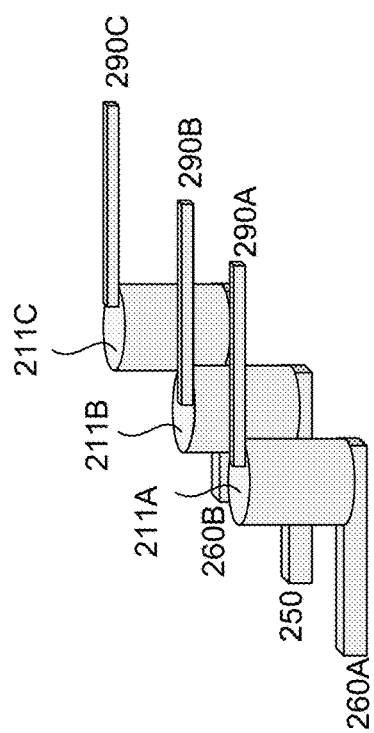
Figure 4A:
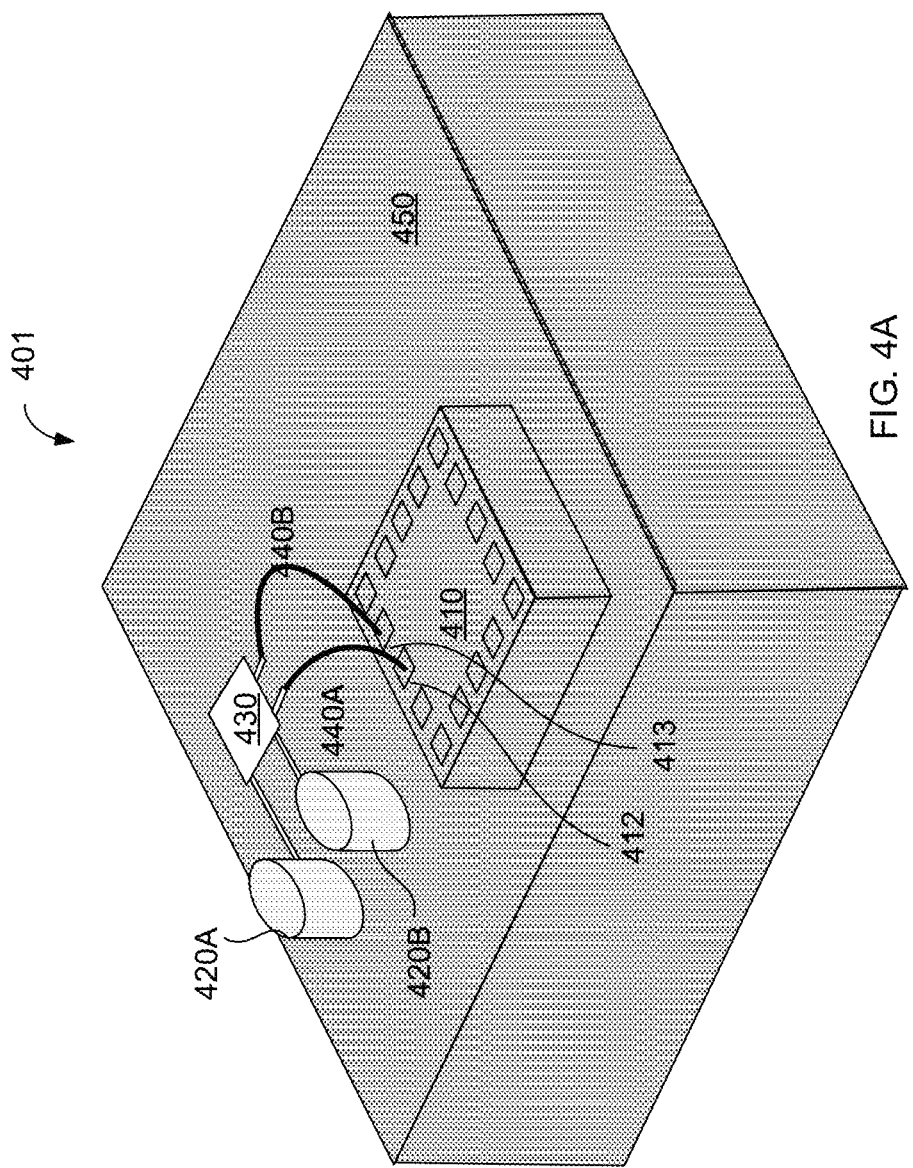
FIG. 4A is a schematic of an example integrated circuit with 2 solder ball per RFFE in one embodiment.

FIG. 4A is a schematic of an example integrated circuit with 2 solder ball per RFFE in one embodiment. The integrated circuit 401 is shown comprising die 410, two solder balls 420A & 420B, on package compensation network (OPCN) 430, wire bonds 440A-40B and package 450. The die 410 provides two interface points 412 and 413 on the die surface. The interface points 412 and 413 carry differential signal. The wire bond/bond pad 440A and 440B connect the interface points 412 and 413 to the input terminals of the OPCN 430. Two solder balls 420A & 420B are placed asymmetrically on the package and two output terminals of the OPCN 430 are connected to the two solder balls 420A and 420B. The solder balls 420A and 420B are positioned such that the line joining the solder balls 420A and 420B is not parallel to the edge of the integrated circuit 401. In one embodiment, the line joining the solder balls 420A and 420B is perpendicular to the edge of the integrated circuit 401.

Figure 4B:
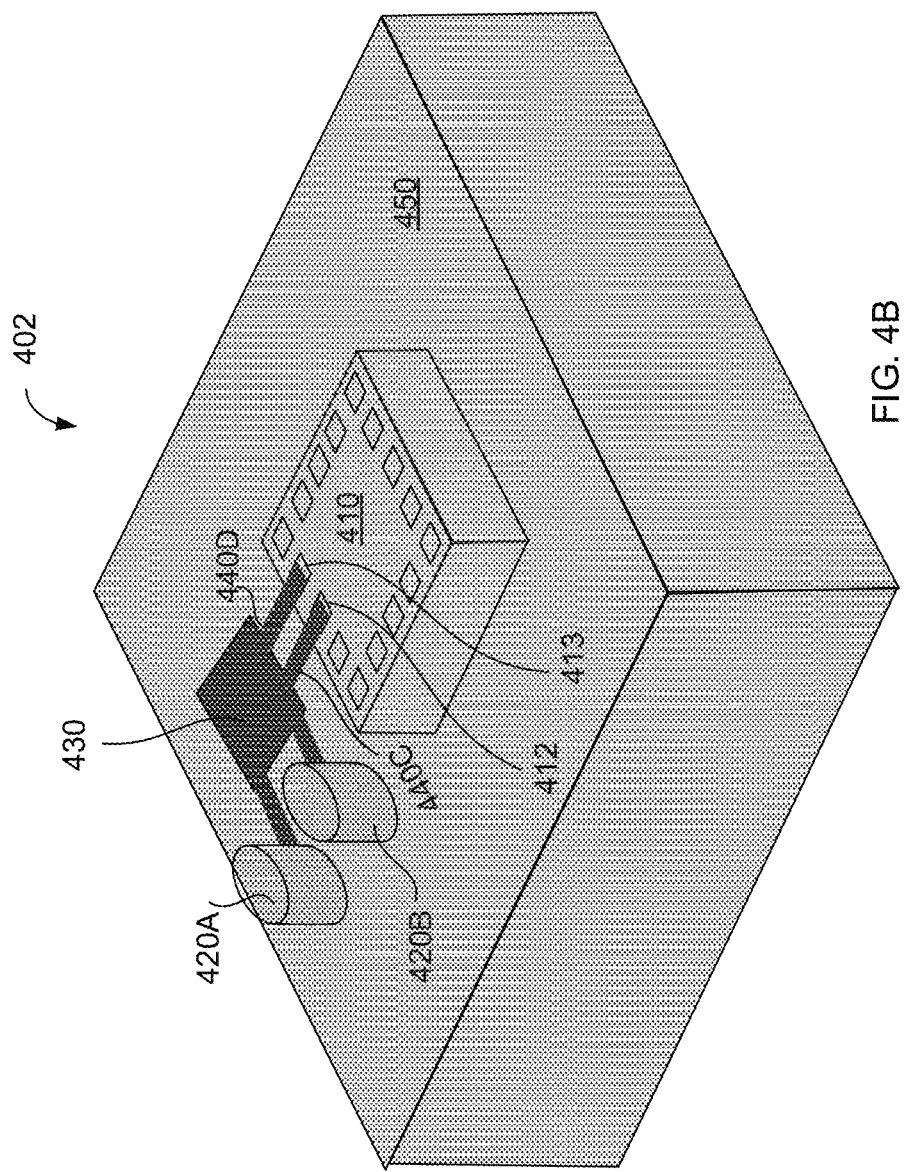
FIG. 4B is a schematic of an example integrated circuit with eELB package with 2 solder ball per RFFE in one embodiment.

FIG. 4B is a schematic of an example integrated circuit with eELB package with 2 solder ball per RFFE in one embodiment. The integrated circuit 402 is shown comprising die 410, two solder balls 420A & 420B, on package compensation network (OPCN) 430, conductive strips 440C-440D, planar surface 445 and package 450. The interface points 412 and 413 carry differential millimetre wave signal. The conductive strips 440C and 440D formed on the inner surface of the plane 445 connect the interface points 412 and 413 to the input terminals of the OPCN 430. Two solder balls 420A & 420B are placed asymmetrically on the package and two output terminals of the OPCN 430 are connected to the two solder balls 420A and 420B. The solder balls 420A and 420B are positioned such that the line joining the solder balls 420A and 420B is not parallel to the edge of the integrated circuit 401. In one embodiment, the line joining the solder balls 420A and 420B is perpendicular to the edge of the integrated circuit 401.

Figure 4C:
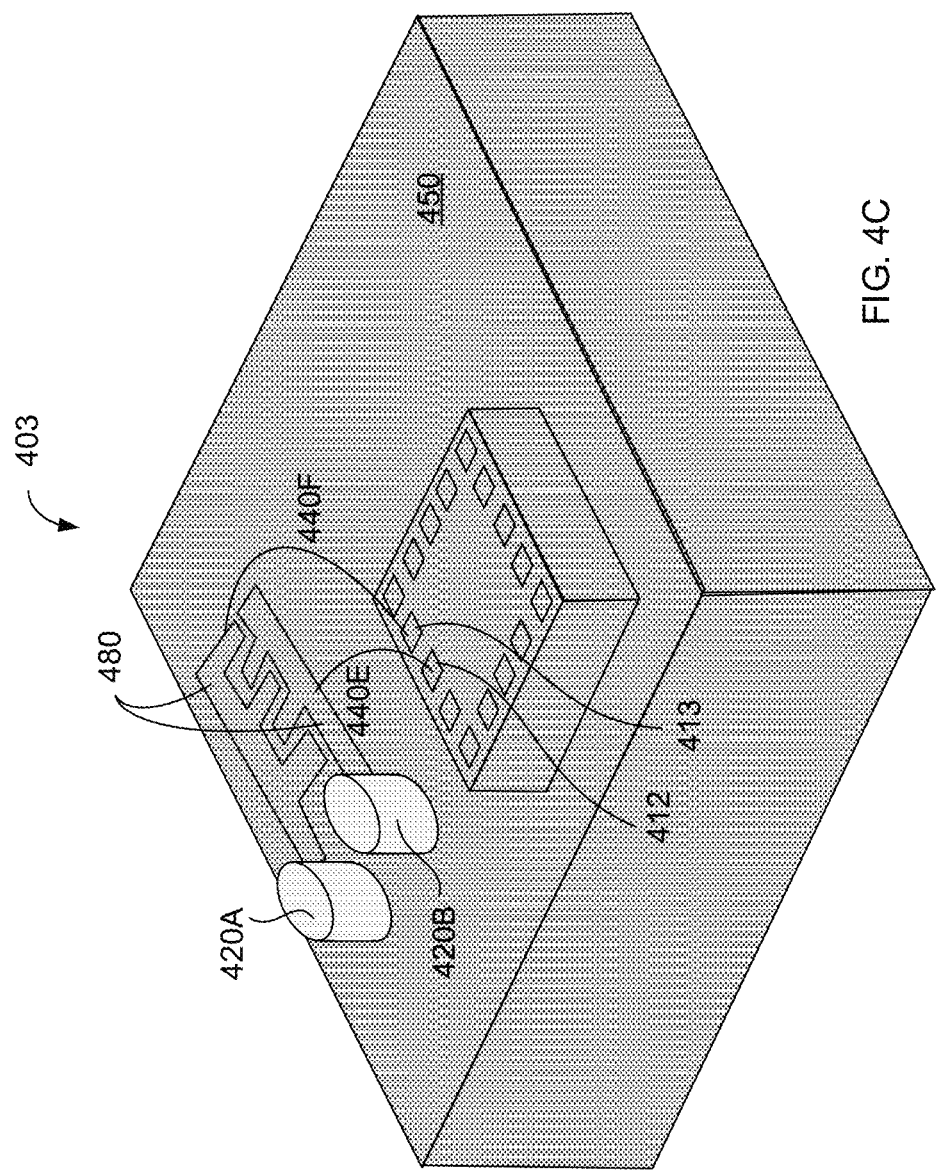
FIG. 4C depicts coupling of terminals of the comb capacitor to the interface points through wire bonds.

The OPCN 430 is a network comprising at least one of inductor and capacitor is formed on the insulator package 450. For example, in case of eWLB package the OPCN 430 may be formed on the inner surface of the plane 445. The manner in which the OPCN 430 may be implemented on the package in multiple embodiments are depicted in FIGS. 4C and 4D. As shown there, a comb capacitor 480 is formed between the balls 420A & 420B on the package. In FIG. 4C, depicting an example integrated circuit 403, the terminals of the comb capacitor are coupled to the interface points through wire bond 440E and 440F. In FIG. 4D, depicting an example millimetre wave integrated circuit 404, the terminals of the comb capacitor are coupled to the strip pads 440G and 440H for propagating millimetre wave signals. The comb capacitor 480, strip pads 440G and 440H may be formed on the inner surface of the plane 445.

The OPCN 430 (in the form of the comb capacitor 480 as an example) and the asymmetric positioning of the balls 420A & 420B enable direct CPW interface on the PCB with the Balls 420A and 420B. As a result, the integrated circuit 401-404 may be interfaced to CPW paths with two balls counts per RFFE. Thereby reducing the ball count per RFFE and still providing the reduction in the attenuation of millimetre wave on the PCB. The manner in which the integrated circuit may be interfaced on a PCB in an embodiment is further described with reference to FIG. 4E.

Figure 4E:
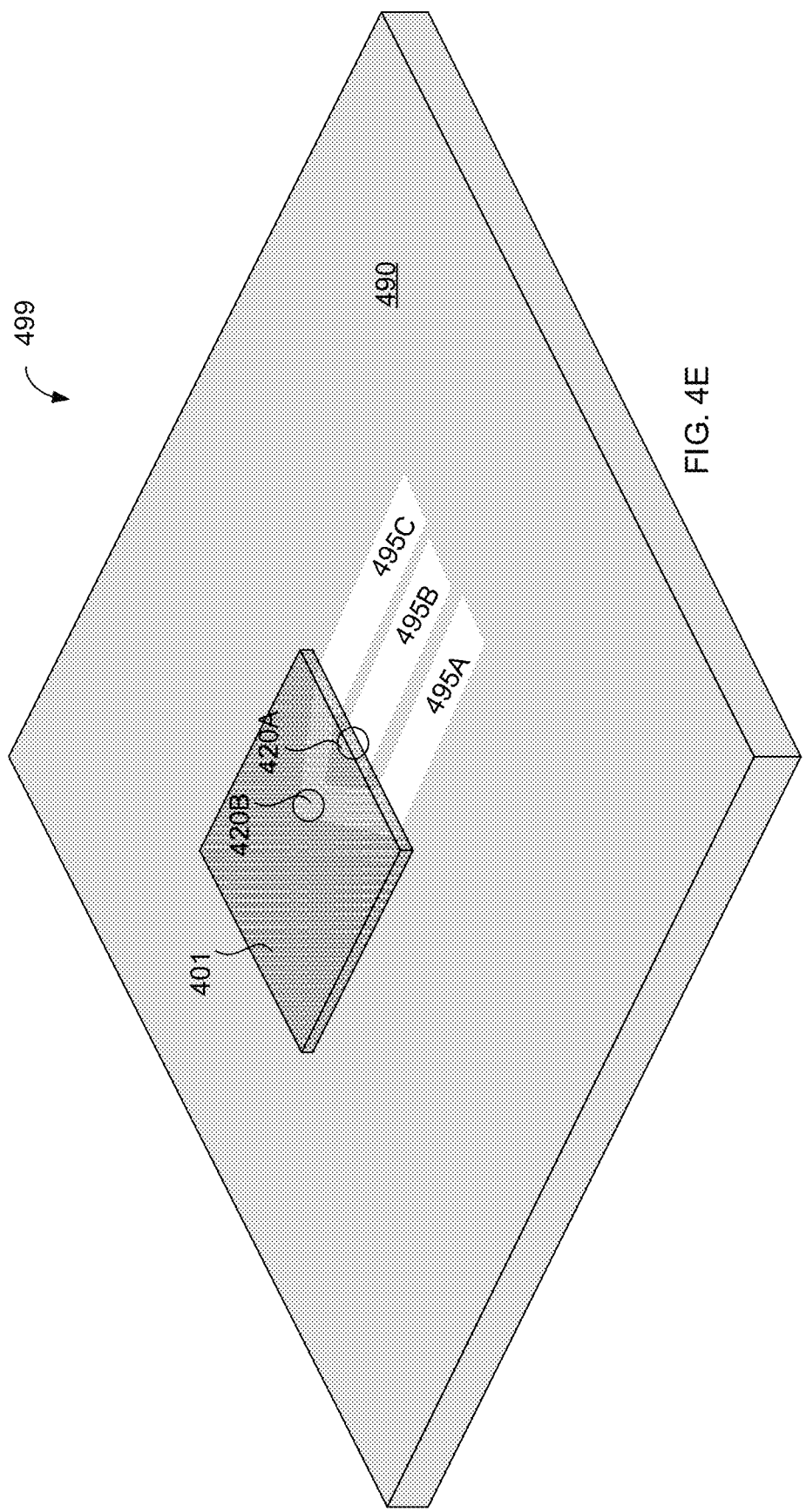
FIG. 4E is an example electronic system in an embodiment.

FIG. 4E is an example electronic system in an embodiment. The electronic system 499 is shown comprising the intergrade circuit 401 and PCB 490. The PCB 490 is shown with CPW paths 495A-C. As shown there, the two ground paths 495 A and C converge to join at the second ball 420B. The signal path 495B that is between the ground paths 495A and 495C is connected to the ball 420A that is near to the edge of the integrated circuit (or in front). FIG. 4F depicts the details of the OPCN 430 on the package and CPW 495A-C on the PCB connected to Balls 420A and 420B. As a result, the electronic 499 system interfaces differential two balls per RFFE to CPW path without a Balun on the PCB 490. The electronic system 499 may be employed in a system having large number of RFFEs. An example system employing larger number of RFFE is further described below.

Figure 5:
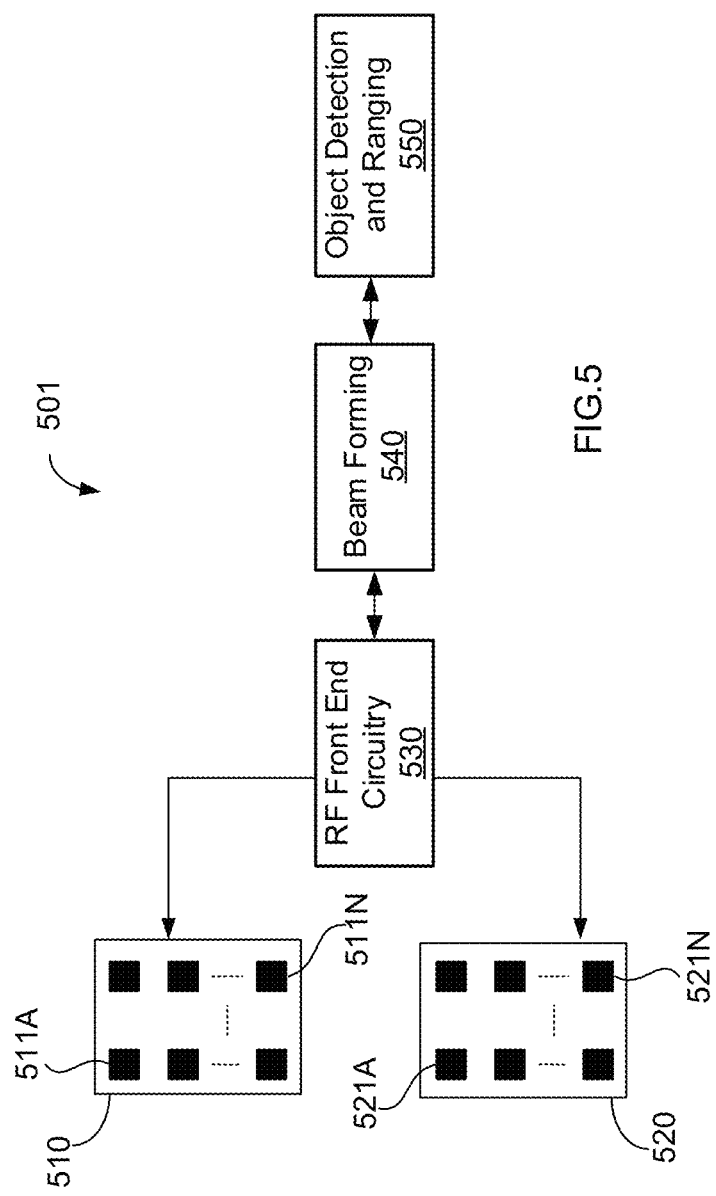
FIG. 5 is a radar system in an embodiment.

FIG. 5 is a radar system in an embodiment. The radar system 501 is shown comprising transmitting antenna array 510, receiving antenna array 520, RF front end 530, beam former 540 and object detection and ranging 550. Each element is further described below.

The transmitting antenna array 510 transmits the radar signal over a desired area. Transmitting antenna array 510 is shown comprising antenna elements 511A-N arranged in a matrix form. The transmitting antenna array 510 forms a beam. The aperture of the beam is proportional to the number of the antenna element N. larger the number N, the finer is the aperture. For a high resolution of object detection, the larger number of antennas is employed.

Similarly, the receiving antenna array 520 receives the radar signal reflected for one or more objects. The receiving antenna array 520 is shown comprising antenna elements 521A-N arranged in a matrix form. The receiving antenna array 510 enables beam formation of the received signals.

The beam former 540 and forms the beam from the set of signals received on path 534 using known beam forming techniques. The beam thus formed is provided on the path 545. The object detection and ranging 550, determines the presence/absence of an object and its shape and range as is well known in the art.

The RF front end 530, generate a phase shifted versions of N radar signal to be transmitted over transmitting antenna array 510 and at the same time receives the N signals received on the receiving antenna array 520. The RF front end 530 perform signal conditioning on the N signals received from the receiving antenna array 520 and provides the same on path 234 for further processing. In one embodiment the radar signal is a millimetre wave if frequency greater than 10 GHz. In one embodiment, the beam former 540, object detection and ranging 550, and the RF front end 530 are deployed within a die and the antennas 511A-N and 521A-N are deployed on a PCB. The path 531 and 532 comprises 2N numbers of CPW paths on the PCB, and differential path on the integrated circuit.

Figure 6:
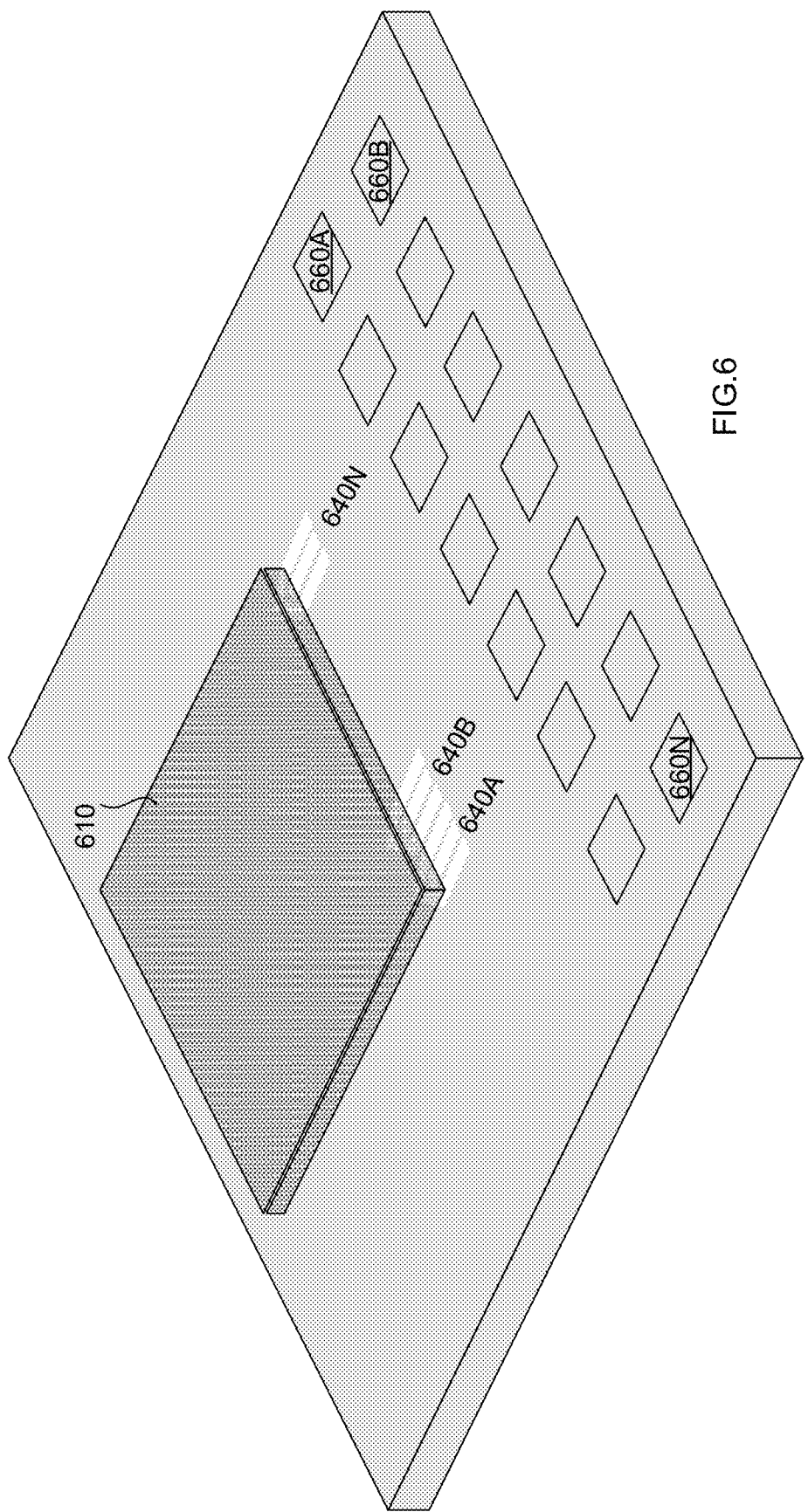
FIG. 6 illustrates the example implementation of the system may be implemented in an embodiment.

FIG. 6 illustrates the example implementation of the system 501 may be implement in an embodiment. As shown there, the integrated circuit 610 comprises N pair of solder balls corresponding to N number antenna elements 660A-N. The interface between the N pair of solder balls and the N antenna elements 660A-N is provided through N CPW paths 640A-N each comprising tow ground paths and a signal path in between. Thus, the integrated circuit 610 may be implemented with 2N solder balls and N CPW paths as against 3N solder balls and N number of CPW paths in the conventional system to connect N antenna element to the die.

For example, the beam former 540, the object detection and ranging 550 and the RF front end 530 may be deployed within the die 480. The antenna array 510 and 520 may deployed on the PCB 490. The RF front end may provide 2N pairs of interface points on the die 480 (N pair for transmit antenna array 510 and N pair for receiving antenna array 520). The PCB 490 may be deployed with 2N number of CPW paths 495A-C connecting the 2N antenna.

Often the CPW interface is converted to micro strip antenna. In that the signal carrying strip is presented on a layer above a ground layer as is well known in the art. Accordingly, the manner in which the CPW interface may be transitioned to micro strip on a PCB is further described below.

Figure 7B:
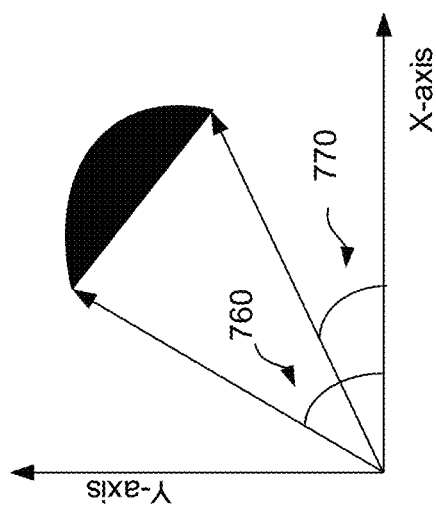
FIGS. 7A and 7B illustrates an example transition of CPW to micro strip line in one embodiment.
Figure 7A:
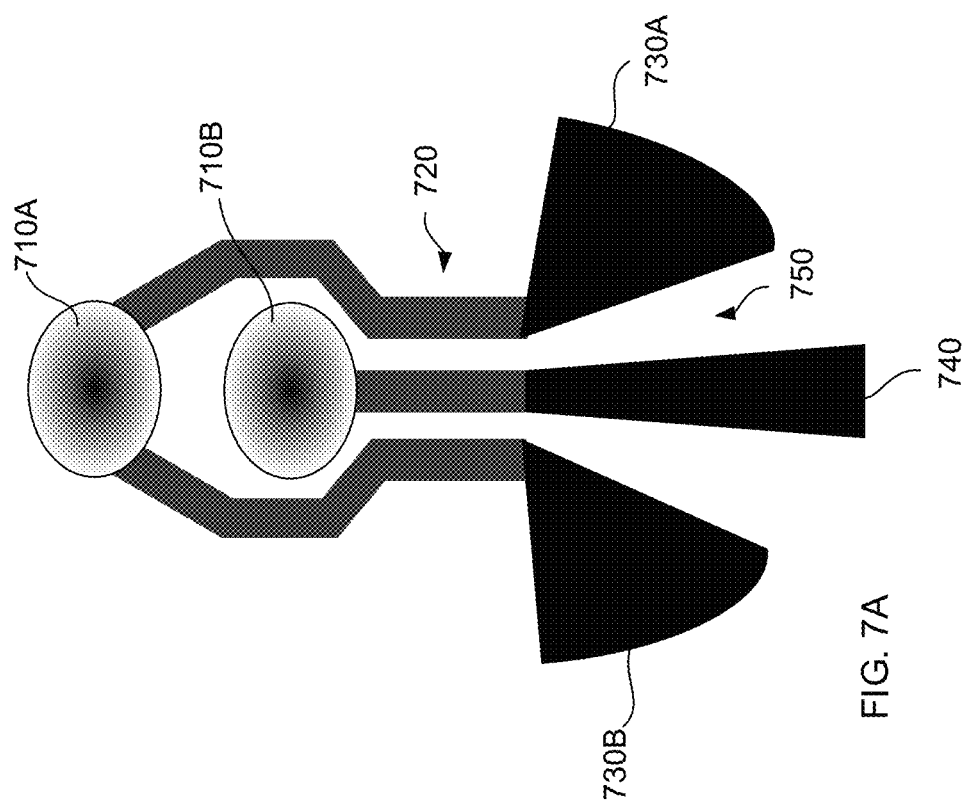

FIGS. 7A and 7B illustrates an example transition of CPW to micro strip line in one embodiment. In FIG. 7A, solder balls 710A and 710B, three CPW paths (together represented as) 720 are formed in accordance with the embodiments described in the sections above. The centre conducting strip in the CPW 720 carry millimetre wave signal and the adjacent strips carry return signal (or coupled to ground).

The centre signal carrying strip of the CPW 720 continue to form micro strip line 740, while the adjacent grounds strips are terminated to allow a new ground plane below the micro strip 740. In one embodiment, the two ground strips form flaring arcs 730A and 730B, (i.e., termination of the ground strips are made with two wing pads 730A and 730B with gap between the signal carrying strip and the ground strips increasing along the line of the extension of the signal strip as shown by 750). Due to such structure, the attenuation and performance of the millimetre signal coupling is enhanced.

In one embodiment, the length of the wing along the line of the extension of the signal and perpendicular direction, the angle of flaring 750, and the angle of the arc are set in accordance with the relation:

$X=L\times[\cos\theta_1-\cos\theta_2]$ and $Y=L\times[\sin\theta_1-\sin\theta_2]$, in that the X is the length of the wing along the micro strip, Y is the length of the wing in a direction perpendicular to the micro strip and the L is Flaring length determined by resonant frequency. FIG. 7B illustrates the angle relation $\theta_1$ (760) and $\theta_2$ (770). In that X-axis represents the direction of the propagation of the millimetre signal. As an example, for signal of frequency in the range of 80 to 89 GHz, the value of $\theta_1$ may be set to $\pi/3$ and $\theta_2$ may be set to $\pi/8$ radians.

While various embodiments of the present disclosure have been described above, it should be understood that they have been presented by way of example only, and not limitation. Thus, the breadth and scope of the present disclosure should not be limited by any of the above-discussed embodiments, but should be defined only in accordance with the following claims and their equivalents.

What is claimed is:

1. An electronic system (499) operative on a millimeter signal comprising:
    an integrated circuit (401) comprising a first solder ball (420A) and a second solder ball (420B) respectively coupled to a positive and a negative signal interface points (412 and 413) of a differential millimeter signal on a die (410) housed in the integrated circuit (401), wherein the first and the second solder balls (420A and 420B) are positioned one behind other from an edge of the integrated circuit (401); and
    a three-path coplanar waveguide (CPW) comprising a center path (495B) and a two adjacent paths (495A and 495C) formed on a printed circuit board (PCB) (490) such that the center path (495B) is coupled to the first solder ball (420A) that is in front and the two adjacent paths (495A and 495C) coupled to the second solder ball (420B) that is behind the first solder ball (420A).

2. The electronic system of claim 1, further comprising plurality of strip pads (440G and 440H) formed on an inner surface (445) of a package housing the die to form the integrated circuit such that, the plurality of strips (440C and 440D) makes electrical connectivity with the first and the second solder balls (420A and 420B) and the positive and the negative interface points (412 and 413) on the die (410) when the package is an extended wafer level ball package (eWLB).

3. The electronic system of claim 2, further comprising a compensation network (430) electrically interposed between the first and second solder balls (420A and 420B) and the positive and the negative interface points (412 and 413) on the die (410), in that the compensation network (430) is formed on the eWLB package of the integrated circuit (401).

4. The electronic system of claim 2, further comprising a transition structure on the PCB (490) to provide transition from the CPW (720) to a micro strip line (740), in that, the transition structure provides flaring of the two adjacent paths at first angle away from the center path, where the center path transition to micro strip line (740).

5. The electronic system of claim 4, wherein the transition structure from a wing on each of the two adjacent paths with an arc angle, a first length along the center path and second length on the other side of the wing.

6. The electronic system of claim 4, wherein the first angle, arc angle follows a relation:

$X = L \times [\cos \theta_1 - \cos \theta_2]$ and $Y = L \times [\sin \theta_1 - \sin \theta_2]$, in that the X is the length of the wing along the micro strip line, Y is the length of the wing in a direction perpendicular to the micro strip and the L is Flaring length determined by resonant frequency.

\* \* \* \* \*